United States Patent [19]

Schierz et al.

[11] 4,209,799
[45] Jun. 24, 1980

[54] SEMICONDUCTOR MOUNTING PRODUCING EFFICIENT HEAT DISSIPATION

[75] Inventors: Winfried Schierz, Roth; Claus Butenschön, Nüremberg, both of Fed. Rep. of Germany

[73] Assignee: Semikron, Gesellschaft für Gleichrichterbau und Elektronik m.b.H., Nüremberg, Fed. Rep. of Germany

[21] Appl. No.: 827,341

[22] Filed: Aug. 24, 1977

[30] Foreign Application Priority Data

Aug. 28, 1976 [DE] Fed. Rep. of Germany ....... 2638909

[51] Int. Cl.² .................... H01L 23/02; H01L 25/04
[52] U.S. Cl. ......................................... 357/81; 357/82; 165/80 C
[58] Field of Search ............. 357/80, 81, 82; 165/80, 165/105; 174/16 HS

[56] References Cited

U.S. PATENT DOCUMENTS

| | | | |
|---|---|---|---|
| 2,730,663 | 1/1956 | Harty | 357/81 |
| 2,862,159 | 11/1958 | Wayworth | 357/81 |
| 2,907,935 | 10/1959 | Nagorsen | 357/81 |
| 3,396,361 | 8/1968 | Sussman | 357/81 |
| 3,483,444 | 12/1969 | Parrish | 357/81 |
| 3,739,234 | 6/1973 | Bylund et al. | 357/82 |
| 3,768,548 | 10/1973 | Dilay et al. | 357/82 |
| 3,834,454 | 9/1974 | Gammel et al. | 357/82 |
| 3,918,084 | 11/1975 | Schierz | 357/82 |
| 4,020,399 | 4/1977 | Suzuki et al. | 357/82 |
| 4,036,291 | 7/1977 | Kobayashi et al. | 357/82 |
| 4,047,197 | 9/1977 | Schierz | 357/81 |

*Primary Examiner*—Stanley D. Miller
*Attorney, Agent, or Firm*—Spencer & Kaye

[57] ABSTRACT

In order to efficiently dissipate heat from both sides of a semiconductor device to an associated cooling element, the device is contacted at its two load current conducting sides by conductive contacting elements and the contacting elements are both firmly connected to the cooling element in a thermally conductive and electrically insulating manner.

27 Claims, 6 Drawing Figures

SEMICONDUCTOR MOUNTING PRODUCING EFFICIENT HEAT DISSIPATION

BACKGROUND OF THE INVENTION

The present invention relates to a semiconductor arrangement of the type including at least one semiconductor device and a cooling element to dissipate the heat produced in the device.

In conventional semiconductor arrangements, a metallic part of the housing, in which the semiconductor device, in the form of a wafer, is enclosed and which simultaneously serves as a current conductor, is permanently attached, in a planar relationship, to a cooling element, while a further current conductor for the semiconductor device passes through the housing in an insulated manner and is connected to external current connection elements. Frequently unilateral or unidirectional, cooling of such arrangements, on the side provided with the cooling element, results in insufficient dissipation of the heat produced during use while the further current conductor often not only does not dissipate heat but also produces additional heat as a result of having insufficiently small dimensions. Such unilateral cooling with the aid of a cooling element consequently limits the use of such arrangements and reduces their operating efficiency.

It is known to overcome these difficulties by designing semiconductor rectifier devices particularly those required to handle high currents, with a disc-shaped housing and to fasten two mutually insulated cooling elements therebetween. Such a structure permits optimum dissipation of the heat to both sides of the rectifier device. However, such bilateral cooling by two separate cooling elements entails considerable fabrication costs for the cooling devices and requires the provision of additional space and additional structural measures to electrically insulate these cooling elements from one another.

In other known semiconductor arrangements with high current handling capabilities, two semiconductor rectifier elements having a disc-shaped housing bottom and a cap-shaped upper housing portion are spatially and electrically connected in parallel opposition between two disc-shaped cooling elements. Each rectifier element is thus cooled at its lower portion of the housing by its associated cooling element and, at its further current conductor which passes through the upper portion of the housing, by the cooling element of the other rectifier element to which it is connected. Thus, it is cooled on both sides by two cooling elements.

In another known embodiment of a parallel opposition connection, each one of the two rectifier elements is fastened to one of two cooling elements lying in one plane and its further conductor is firmly connected, via contact bars, with the respective other cooling element. In this case again, each rectifier element is cooled on both sides by two cooling elements.

SUMMARY OF THE INVENTION

It is an object of the present invention to provide a semiconductor arrangement in which the semiconductor device is optimally cooled on both load current connection sides by one cooling element.

This and other objects are achieved according to the invention by the provision, in combination with a semiconductor device having two load current conducting contacts each at a respective side of the device and a cooling element for dissipating heat generated in the device, of two metallic contacting elements each contacting one of the respective sides of the device and conductively connected to the contact at that side for conducting the load current of the device, and means firmly connecting each contacting element to the cooling element in a thermally conducting and electrically insulating manner.

BRIEF DESCRIPTION OF THE DRAWINGS

FIG. 2 is a view similar to that of FIG. 1 of a second preferred embodiment of the invention.

FIG. 2b is an end view in the direction of the arrow X of FIG. 2a.

FIG. 2c is a detail view, to an enlarged scale, of a portion of the arrangement of FIG. 2a.

DESCRIPTION OF THE PREFERRED EMBODIMENTS

Figure 1:
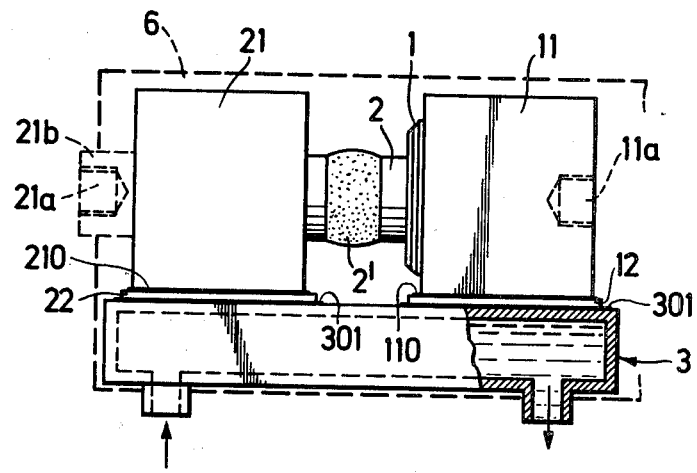
FIG. 1 is a partly schematic elevational view of a first preferred embodiment of a semiconductor arrangement according to the invention.
Figure 2A:
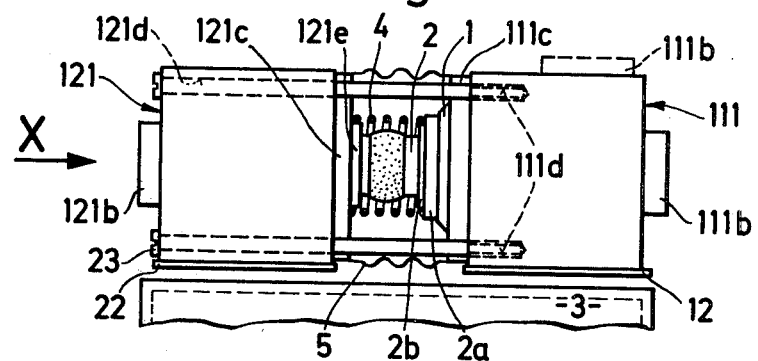
Figure 3:
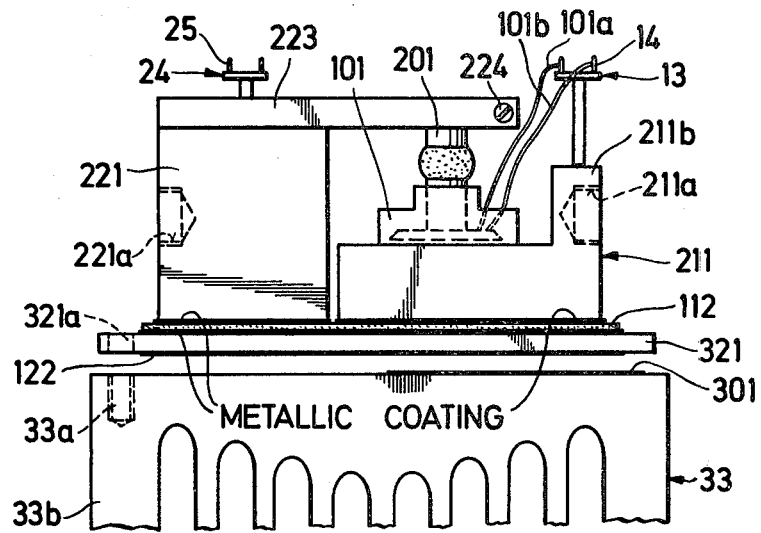
FIG. 3 is an elevational view of a third preferred embodiment of the invention.
Figure 4:
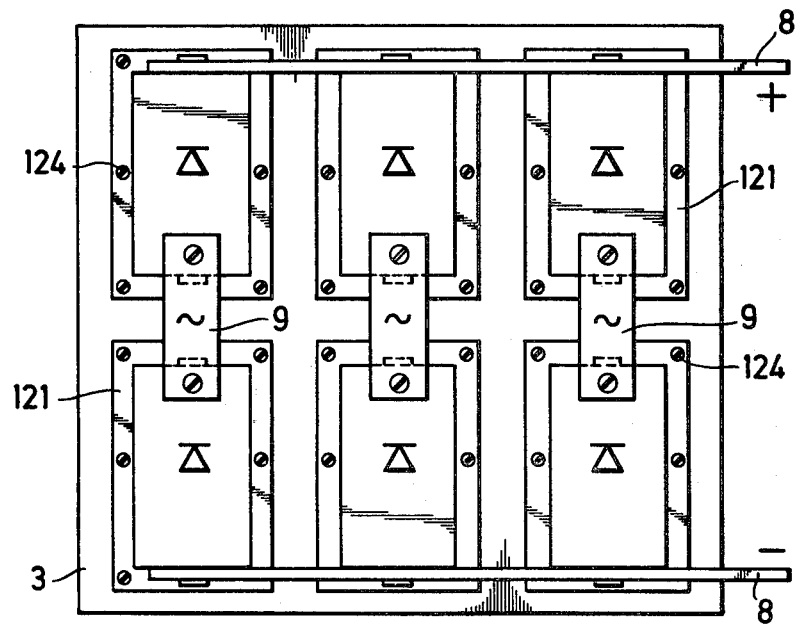
FIG. 4 is a generally schematic view of a fourth preferred embodiment of the invention.

FIG. 1 is a frontal view of a seimconductor arrangement according to the invention including a cooling element 3 for liquid cooling and an unencapsulated semiconductor device contacted by soldering and composed of a semiconductor wafer 1 and its upper current conductor 2. FIG. 2a is a frontal view and FIG. 2b a side view of a structure substantially corresponding to that of FIG. 1 but with a pressure contacted semiconductor device 1, and FIG. 2c is a front view of a section of the structure with a pressure contacted, wafer-shaped, encapsulated semiconductor device. FIG. 3 shows a structure which has an encapsulated semiconductor device which is fastened so as to have its axis of circular symmetry perpendicular to the plane of the cooling device and is intended to be used as a structural unit which includes an intermediate disc and which is fastened on a cooling device for air cooling. FIG. 4 is a schematic representation of a semiconductor arrangement including six rectifier devices in three-phase bridge connection and a structure according to the invention arranged on a common cooling device.

In the different Figures, the same parts bear the same reference numerals.

The first embodiment of the invention shown in FIG. 1, includes a semiconductor device formed of a semiconductor wafer 1 and a conductor member 2 which is fastened on its one side to the wafer and is called the upper current conductor. At the other side of the semiconductor wafer 1, the semiconductor device is firmly connected, by soldering, with a contacting element 11. At the free face of the upper conductor 2, the device is firmly soldered to a contacting element 21.

The two contacting elements 11 and 21 simultaneously serve as current conductors. They are also fastened, likewise by soldering, to a common cooling element 3 for liquid cooling which is designed as a hollow body and is provided with openings for the passage of a coolant in the direction of the arrows.

In order to prevent the occurrence of undesirable corrosion phenomena with a coolant flow which is not free of electric field gradients and the difficulties resultant therefrom, each of contacting elements 11 and 21 is fastened to the cooling element 3 by means of a respective electrically insulating layer 12 or 22 of an oxide ceramic which does not impede the dissipation of heat or of a heat conducting adhesive. If the layer is of oxide ceramic, this layer is permanently connected to its respective contacting element and/or the cooling element with the aid of a respective solder layer 110, 210 or 301.

For a layer of oxide ceramic oxide of aluminium of an in itself known composition or oxide of beryllium may be used respectively a layer of heat conducting, electrically insulating adhesive may consist of a single-component-adhesive based on epoxy e.g. consists of the adhesive, which is known under the trademark name Elecolith manufactured by Bostik.

The metallic contacting elements 11 and 21 may be made of copper and may have a block, prismatic or hemispherical shape. Each element is provided with a threaded bore, 11a or 21a, respectively, at at least one of its free outer faces, e.g. at mutually opposite faces of the two elements, so as to provide a connection for further current conducting members. They may, however, also be provided with an added portion, such as the portion 21b shown for element 21, at the surface intended for the contacting connection, in which the associated threaded bore 21a is provided.

The mutual spacing between contacting elements 11 and 21 is not critical and is determined merely by the space required for a member 2' to give the upper current conductor 2 flexibility so as to be able to compensate for thermal expansion occurring during use of the otherwise rigid structure. The contacting elements are dimensioned so that they assure optimum dissipation of the heat toward the cooling element, but do not themselves act as cooling elements.

The illustrated first embodiment is encapsulated in insulating material 6 in such a manner that the threaded bores 11a and 21a of the contacting elements 11 and 21 and the flowthrough openings of the cooling element 3 remain exposed for connection with appropriate elements. This produces a compact unit. If required, provision may be made at coinciding free outer faces of the contacting elements 11 and 21 for the additional arrangement of components for protective circuits. The encapsulation of insulating material may be composed of a housing and a cast mass in which the components are embedded.

During manufacture of the embodiment shown in FIG. 1, it is advisable to fasten the prefabricated semiconductor device on the contacting element 11 by soldering. For this purpose, the latter may be provided with a solderable coating at the surface section intended for this purpose. Thereafter, the structure formed of members 1, 2 and 11 as well as the contacting element 21, which in order to be soldered to the current conductor 2 is likewise metallized, are arranged on cooling element 3 with the aid of a positioning device and in the appropriate spatial association, together with the insulating layers 12 and 22. A heat treatment is then performed to simultaneously solder all parts to all intended surface sections to form permanent connections. Finally, the structure which has been completed in this manner, is embedded in an insulating mass 6 and thus encapsulated as is shown by the broken line outline.

In the second embodiment shown in FIG. 2a, contacting elements 111 and 121 each have a special configuration for establishing a pressure contacted arrangement with the semiconductor device 1, 2. A uniform and reproduceable contact pressure may be established for example, as illustrated by the pressure produced by a mutual and coaxial change in position of the contacting members by pressing on the latter. The common axis for the displacement of at least one contacting element for the purpose of pressure contacting is the axis of rotation, or axial symmetry, of the semiconductor device contacted by the two contacting elements.

For this purpose, each of contacting elements 111 and 121 is provided in the edge region of its respective contacting side facing the semiconductor device with at least three bores, symmetrical to the axis of rotation of the semiconductor device. The bores in one element are aligned with those in the other element. In contacting element 111, these bores are threaded bores 111d which receive setting screws 23, and in contacting element 121 they are guide bores 121d for the electrically insulated passage of screws 23. With the aid of a screw arrangement suitable for a plurality of screws, the semiconductor device arranged between the contacting elements with the described structure can be pressure contacted in the desired manner.

Pressure contacting of the semiconductor device is not per se an object of the present invention and can also be effectuated in a different manner.

A spring element 4, for example in the form of a helix, is provided around the circumference of the upper current conductor 2 so as to enclose it.

The spring element 4 is pressing the end portion of the upper conductor 2 to the contacting surface of the semiconductor wafer and is under tension and fixed by slipping on the portions 2b and 121e.

In order to assure perfect contact functioning even after the structure is embedded in the insulating mass, the semiconductor device and the spring element 4 are accommodated in a protected manner in a bellows 5. The bellows 5 is tightly fitted at both ends over respective projections 111c and 121c of contacting elements 111 and 121. Projections 111c and 121c can be somewhat reduced in diameter relative to the main portions of the contacting elements. Spring element 4 which may also have a telescopic form, is supported at one end by a central projecting reduced diameter portion 121e of matching shape on projection 121c of contacting element 121 and at the other end by a correspondingly shaped projecting portion 2b of a contacting piece 2a of the upper current conductor 2, which contacting piece is in direct contact with semiconductor wafer 1 and is firmly connected thereto.

The depth of the threaded bores 111d is determined by the required minimum length of engagement of the setting screws 23 and by the displacement which contacting element 121 must undergo to produce the requisite contact pressure. Setting screws 23 pass between elements 111 and 121 in the region enclosed by bellows 5.

The structure composed of contacting elements 111 and 121, semiconductor device 1 and setting screws 23, which is stable in itself during the pressure contacting process, may be arranged in any desired manner on cooling element 3 and fastened by soldering as explained in connection with FIG. 1.

Contacting elements 111 and 121 are each provided with a respective extension 111b or 121b on the intended outer contacting surface. These extensions may also be arranged on the upper face, which is oriented to face away from the cooling element, as shown by the broken line position for extension 111b.

Figure 2B:
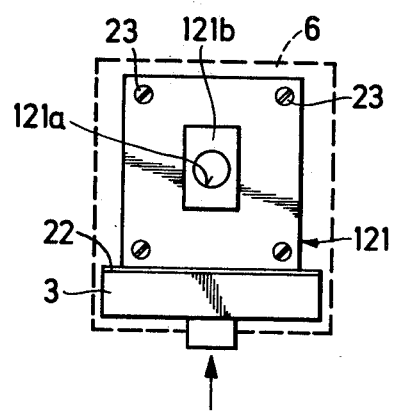
Figure 2C:
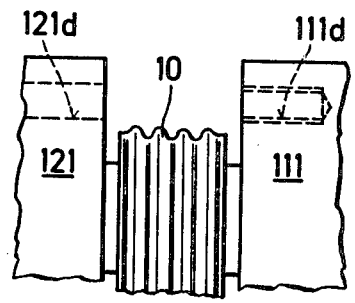

FIG. 2b is an end view looking from the left side of the structure shown in FIG. 2a in the direction of arrow X. The encapsulation 6 of a casting mass is also shown. FIG. 2b further shows that the embodiment of FIG. 2 is provided with four setting screws 23 to generate the contact pressure and that extension 121b is provided with a central threaded bore 121a.

FIG. 2c shows the resulting disc-shaped, encapsulated semiconductor device 10 disposed between the contacting elements 111 and 121 and arranged to be pressure contacted, for example, as described above. Due to the tight encasement of the semiconductor wafer in the disc-shaped housing, it is not necessary to embed the structure in insulating material.

In the manufacture of this second embodiment according to the invention, the semiconductor device 1, 2 is initially placed onto the appropriately held contacting element 111, with the element 111 being oriented so that device 1,2 is on top of the element, i.e. device 1,2 and element 111 are in vertical association. Then spring body 4 is placed on top and bellows 5 is attached to projection 111 at its end which faces contacting element 111. Thereafter, contacting element 121 is suitably positioned and attached, and is aligned with the aid of setting screws 23. After the bellows is pulled over projection 121c, simultaneous advancement of all setting screws 23 produces the required contact pressures. The structure produced in this manner is then subjected to a heat treatment in which both contacting elements 111 and 121 become soldered to cooling element 3 each via an appropriate insulating layer 12 or 22. Insulating layers 12 and 22 may here be preliminarily fastened to the contacting element before the unit is assembled.

In the above-described embodiments, the structure composed of the contacting elements and the semiconductor device is arranged to have its central axis, which coincides with the axis of rotation, or circular symmetry, of the semiconductor device, parallel to the heat contact surface of cooling element 3.

FIG. 3 shows another solution applied to an encapsulated semiconductor device including, for example upper and lower housing members. The semiconductor device, shown in broken lines, is located at the interior of upper housing member 101. The lower housing member 211 is simultaneously a contacting member for the load current electrode at the bottom of the semiconductor device. It has a connecting piece 211b with a threaded recess 211a and corresponds generally with contacting element 11 of the embodiment of FIG. 1. The upper housing member 101 of the semiconductor device is recessed arranged at the upper side of contacting element 211 and is securely fastened there. Upper housing member 101 may, in a known manner, be composed of a metal cap with a glass passage or a ceramic cap with a metal passage, or it may be made of plastic. The upper current conductor 201 for the semiconductor device passes through a passage in the housing and its free end is fastened to a metallic contact bar 223 which forms a connecting piece to a contacting element 221 corresponding to element 21 of FIG. 1.

The free end of the current conductor 201 which preferably has a flexible portion exterior to the housing, may be inserted, for example, into a suitably shaped bore of the contact bar 223, which in this end section is slitted parallel to the plane of FIG. 3, and may be secured by means of a setting screw 224 to clamp the conductor in the contact bar and may additionally be permanently secured with the contact bar by soldering.

In order to assure optimum heat transfer between the current conductor and the contact bar, the conductor is already clamped into the bar during the soldering process. The thickness of the solder layer then becomes uniformly minimal.

The semiconductor device includes a semiconductor wafer with the structure of a thyristor whose auxiliary, or control, leads 101a and 101b are brought to a circuit suppot point 13 supporting a point of connection 14 for lead 101a and fastened in an electrically insulated manner to contacting element 211 and serves to contact the external control and switching components of a circuit into which the device is connected. A corresponding support point 24 carrying a point of connection 25 is provided on contacting element 221. The points of connection 14 and 25 of the contacting supports protrude from the insulating encapsulation (not shown) of the completed arrangement. The control leads 101a and 101b, being gate connection respectively auxiliary cathode connection of the thyristor, are fastened-electrically insulated from the load current contacting elements 211, 221—optionally at a control circuit point 14 or 25 of the support point 13 respectively 24. The support points 13,24 shall be made of an insulating material.

The two contacting elements 211 and 221 are not connected directly with the cooling element by means of an insulating layer 112, as is the case in FIG. 1, but initially to an intermediate plate 321 of a size corresponding to that of the cooling element and preferably made of copper. This intermediate plate 321 may be provided at its free underside with a metallic coating 122 of a material which enhances soldering and is used to connect to the cooling element. It may also be provided with a ductile metallic coating to produce a thermal connection with the cooling element by pressure. Moreover, a ductile noble metal foil may be disposed between the cooling element and the intermediate plate. For this purpose, intermediate plate 321 is provided with a protruding edge region which has through bores 321a for fastening it to the cooling element with screws. A layer of a well known soft solder material e.g. of tin or of tin and silver may be applied as a metallic coating 122 and a foil of silver preferably may be used as a ductile metal coating or a noble metal foil.

In the structure shown in FIG. 3, the semiconductor device may also be pressure contacted. The element can be designed, for example, so that the semiconductor device is disposed between two identically shaped contacting elements and the contacting elements are connected together at their upper sides by an insulatedly attached pressure bar against which a spring element is supported to produce pressure contacting of the semiconductor wafer with the upper current conductor.

Alternatively, a combined contacting may be effectuated by soldering the semiconductor wafer at one side and pressure contacting the other side.

FIG. 3 shows that a structure including contacting elements, a semiconductor device and an intermediate plate can be used as desired independently of the type of cooling employed. For this reason, the cooling element shown in FIG. 3 is an air cooling element 33 having cooling fins 33b. This element may be provided with a solderable coating 301 on the contact face for the intermediate plate. However, a ductile noble metal foil may also be provided between cooling element 33 and intermediate plate 321 if both parts are to be connected together only by pressure. For this purpose the cooling element is provided with threaded bores 33a at appropriate locations.

A structure with intermediate plate can also be produced for arrangements according to FIGS. 1 and 2. This provides, in a surprisingly simple manner, unlimited use for the present invention. Thus, semiconductor power devices having two or more electrodes can be designed as structural units with a semiconductor device or as a structural unit with at least two semiconductor devices accommodated in a common housing and can be accommodated on one cooling element. Due to the potential-free fastening it is also possible to provide devices of any desired electrical connection on a common cooling element. The compact design, the favorable arrangement of further current leads and the optimum thermal load capability as a result of attainment of the best possible cooling on both sides of each semiconductor wafer provide the same advantages in all cases of application.

FIG. 4 shows an embodiment of a structurally particularly simple semiconductor arrangement according to the invention including a plurality of semiconductor devices. Six units, each for example having the form shown in any one of FIGS. 1 to 3, are interconnected on a common cooling element 3 to form a three-phase bridge circuit. The units are fastened, each by means of screws 124 and a respective protruding intermediate plate 321 to the cooling element 3 in two groups of three. To achieve the requisite interconnections, bus bars 8 for the direct current leads provide the external connections to the contacting elements for the three units of each group and each unit of one group is connected with a respective adjacent unit of the other group by a respective bus bar 9 for the three-phase alternating current leads.

Replacement of a defective unit is made possible in the simplest manner without requiring measures affecting the other units.

The present invention is also particularly advantageous for arranging, for example, three units of a circuit group on a common intermediate plate to thus provide a thermal coupling during operation so that the operating behavior of the individual semiconductor devices of each group can even be improved.

In the same favorable and procedurally optimum manner, any other desired circuits containing one or more units per branch connected in series or parallel can be constructed, also including wiring elements, and it is particularly easy, for example, to remove units or groups of units or circuits from a cooling element for air cooling and fasten them on a correspondingly dimensioned cooling element for liquid cooling in order to attain better performance, e.g. higher outputs.

In order to promote the connection of the contacting elements to the intermediate plate, at least the latter is provided on its respective side with a solder-enhancing metallic coating of a well known material e.g. of tin or silver or an alloy of that metals or an alloy with at least one of these metals. Known materials are for example compositions of 90% tin and 10% silver; 95% tin and 5% antimone; 90,5% tin, 5% antimone, 2,5% copper, 2% cadmium; 88% tin and 10% cadmium and 2% silver, each in percent per weight. It is to be understood, that the invention is not limited to the mentioned materials, but it is possible to use further compositions for the solder connection of the said components.

With the solder process to connecting the intermediate plate and the contacting elements, each having a metallic coating, are subjected to e.g. a heat treatment in a continuous furnace at a temperature according to the applied solder materials.

Further in order to improve the heat dissipation of the intermediate plate to the cooling element the surface of the both components may be treated for example by lapping.

It will be understood that the above description of the present invention is susceptible to various modifications, changes and adaptations, and the same are intended to be comprehended within the meaning and range of equivalents of the appended claims.

What is claimed is:

1. In combination with a semiconductor device having two load current conducting contacts each at a respective contacting side of the device and a single cooling element for dissipating heat generated in the device, the improvement comprising: two metallic contacting elements each contacting one of said respective sides of said device and conductively connected to said contact at that side for conducting the load current of said device, and means firmly connecting each of said contacting elements to said cooling element in a thermally conducting electrically insulating manner, said contacting elements being constructed, and being connected to said sides of said device and to said cooling element, for optimally cooling said device at each contacting side thereof by optimally dissipating heat from each said contacting side to said cooling element, without themselves acting as cooling elements, while simultaneously conducting the load current of said device.

2. An arrangement as defined in claim 1 wherein said semiconductor device is firmly connected by soldering at its contacting sides to each said contacting element.

3. An arrangement as defined in claim 1 further comprising a spring element firmly connecting said semiconductor device to said contacting elements.

4. An arrangement as defined in claim 1 wherein each said contacting element is provided at one of its free outer faces, with a threaded bore for fastening to an external current lead.

5. An arrangement as defined in claim 1 wherein said cooling element is a liquid cooling element.

6. An arrangement as defined in claim 1 wherein said cooling element is an air cooling element.

7. An arrangement as defined in claim 1 wherein said semiconductor device is unencapsulated and comprises a semiconductor wafer having at least two layers of alternatingly opposite conductivity types and an at least partly flexible upper current conductor.

8. An arrangement as defined in claim 1 wherein said semiconductor device comprises a semiconductor wafer having at least two layers of alternatingly opposite conductivity types and an at least partly flexible upper current conductor, further comprising a housing containing said wafer and including a lower portion and a cap-shaped upper portion.

9. An arrangement as defined in claim 8 wherein said lower housing portion is constituted by one of said contacting elements.

10. An arrangement as defined in claim 1 wherein said semiconductor device comprises a semiconductor wafer and contacting discs contacting both its contacting sides, and further comprising a disc-shaped housing containing said device and establishing pressure contact between said device and said contacting elements.

11. An arrangement as defined in claim 1 wherein said contacting elements are in heat conducting communication with said cooling element along a common plane and said semiconductor device has a circular form and is arranged with its axis of circular symmetry parallel to said common plane.

12. An arrangement as defined in claim 1 wherein said contacting elements are in heat conducting communication with said cooling element along a common plane, said semiconductor device has a circular form and is disposed with its axis of circular symmetry perpendicular to said common plane, and one of said contacting elements comprises a main body portion connected to said cooling element and a contacting bar portion conductively connected to said contact at its associated contacting side of said device.

13. An arrangement as defined in claim 1 wherein said means comprise a respective layer of oxide ceramic fastened between each said contacting element and said cooling element for electrically insulating its said contacting element from said cooling element.

14. An arrangement as defined in claim 13 wherein each said layer of oxide ceramic is connected with its said contacting element and said cooling element by soldering.

15. An arrangement as defined in claim 1 wherein said means comprise a layer of heat conducting, electrically insulating adhesive fastening each said contacting element in an electrically insulating manner to said cooling element.

16. An arrangement as defined in claim 1 further comprising two contact carriers each mounted on a respective contacting element at the side thereof facing away from said cooling element, and two electrical contact members each carried by a respective carrier and arranged for connection to external circuit components.

17. An arrangement as defined in claim 1 further comprising a mass of insulating material encapsulating said semiconductor device, said contacting elements and at least part of said cooling element and wherein said contacting elements are provided with external connection portions projecting out of said mass.

18. An arrangement as defined in claim 1 wherein said means comprise a metallic intermediate plate and a layer of electrically insulating material, and wherein said contacting elements are fastened to said intermediate plate through the intermediary of said layer and said intermediate plate is secured between said contacting elements of said cooling element.

19. An arrangement as defined in claim 18 wherein said intermediate plate is provided with an edge region which projects laterally beyond said contacting elements for establishing a flange type connection with said cooling element, said intermediate plate is provided with openings for passage of attachment screws, and said cooling element is provided with threaded bores aligned with said passeges for threaded engagement with such screws.

20. An arrangement as defined in claim 18 wherein said means further comprise a solderable metallic coating interposed between said intermediate plate and said contacting elements and soldered to said contacting elements and said layer of insulating material, and said intermediate plate and said cooling element are surface treated at their mutually facing surfaces.

21. An arrangement as defined in claim 20 further comprising a ductile noble metal coating interposed between said cooling element and said intermediate plate.

22. An arrangement as defined in claim 1 wherein there are a plurality of said semiconductor devices and a plurality of groups of said two metallic contacting elements, each said group being associated with, and forming a unit with, a respective semiconductor device, and there is one said cooling element common to all of said devices and firmly connected to all of said groups of contacting elements.

23. An arrangement as defined in claim 22 further comprising means electrically interconnecting two of said units via respective ones of other associated contacting elements.

24. An arrangement as defined in claim 22 wherein said units are spatially separated from one another.

25. An arrangement as defined in claim 22 further comprising a mass of insulating material encapsulating two of said units and said two units form part of an electrical circuit and are electrically interconnected.

26. In combination with a semiconductor device having two load current conducting contacts each at a respective contacting side of the device and a cooling element for dissipating heat generated in the device, the improvement comprising: tow large volume metallic contacting elements each contacting one of said respective sides of said device and conductively connected to said contact at that side for conducting the load current of said device, and means firmly connecting each of said contacting elements to said cooling element in a thermally conducting electrically insulating manner, wherein each of said elements is dimensioned to establish a heat dissipation path between its associated side of said device and said cooling element having a minimum cross section at least as large as that of said contact at that side to cause said elements to effect optimum heat dissipation from both sides of said device while simultaneously conducting the load current of said device.

27. An arrangement as defined in claim 26 wherein each said element has a block-like shape.

* * * * *